United States Patent
Yoshimoto et al.

(10) Patent No.: US 6,990,380 B2
(45) Date of Patent: Jan. 24, 2006

(54) SUBSTRATE PROCESSING APPARATUS AND INFORMATION STORAGE APPARATUS AND METHOD

(75) Inventors: Yuji Yoshimoto, Kumamoto (JP); Ryouichi Uemura, Kumamoto (JP); Kunie Ogata, Kumamoto (JP); Yoichi Deguchi, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 220 days.

(21) Appl. No.: 10/023,898

(22) Filed: Dec. 21, 2001

(65) Prior Publication Data

US 2002/0116076 A1  Aug. 22, 2002

(30) Foreign Application Priority Data

Dec. 27, 2000  (JP) ........................... 2000-398477
Apr. 4, 2001   (JP) ........................... 2001-105854

(51) Int. Cl.
      G05B 11/01       (2006.01)

(52) U.S. Cl. ............... 700/20; 700/19; 700/2; 700/9; 700/121

(58) Field of Classification Search .............. 700/2, 700/9–10, 19–20, 121, 1, 26, 95, 117; 438/5, 438/14

See application file for complete search history.

(56) References Cited

U.S. PATENT DOCUMENTS

| | | | | |
|---|---|---|---|---|
| 5,555,195 A | * | 9/1996 | Jensen et al. | ............... 700/276 |
| 5,591,299 A | * | 1/1997 | Seaton et al. | ............... 700/121 |
| 6,233,492 B1 | * | 5/2001 | Nakamura et al. | ............. 700/2 |
| 6,363,294 B1 | * | 3/2002 | Coronel et al. | ............. 700/121 |
| 6,424,880 B1 | * | 7/2002 | Goder et al. | ................. 700/121 |
| 6,445,443 B1 | * | 9/2002 | Park et al. | ..................... 355/77 |
| 6,606,524 B1 | * | 8/2003 | Byun et al. | ................... 700/19 |
| 2001/0001839 A1 | * | 5/2001 | Lin et al. | ..................... 700/121 |
| 2002/0019965 A1 | * | 2/2002 | Bims et al. | ................. 714/748 |

FOREIGN PATENT DOCUMENTS

| | | |
|---|---|---|
| JP | 11-015502 | 1/1999 |
| JP | 11-074170 | 3/1999 |
| JP | 11-119614 | 4/1999 |
| JP | 11-184513 | 7/1999 |
| JP | 11-296352 | 10/1999 |
| JP | 2000-343386 | 12/2000 |
| JP | 2001-100981 | 4/2001 |

* cited by examiner

Primary Examiner—Anthony Knight
(74) Attorney, Agent, or Firm—Oblon, Spivak, McClelland, Maier & Neustadt, P.C.

(57) ABSTRACT

An object of the present invention is to grasp easily a process history of a target object such as a semiconductor wafer. The processing apparatus of the present invention includes: a processing apparatus body which includes a plurality of process units for executing a prescribed process to a target object, and transport mechanism for transporting said target object between the process units; a first controller for controlling the processing apparatus as a whole; a second controller for controlling the process units; an information storage section for taking in a signal transmitted and received between the first and second controllers; and a host computer for monitoring operation states of the process units. The present invention is extended to a processing system including a plurality of the processing apparatuses connected with a host computer which is further connected with a monitor computer through a communication network.

6 Claims, 12 Drawing Sheets

SUBSTRATE PROCESSING APPARATUS AND INFORMATION STORAGE APPARATUS AND METHOD

BACKGROUND OF THE INVENTION

1. Field of the Invention

The present invention relates to a processing apparatus for executing a prescribed process to an object target and particularly to a processing apparatus including two kinds of control units and information storage apparatus and method used thereof.

2. Description of the Related Art

For manufacturing a semiconductor device, various processes are executed such as a deposition process for depositing a prescribed film on an object target such as a semiconductor wafer, a photolithography process for patterning the prescribed film, an etching process for etching the prescribed film in accordance with the pattern. Accordingly, a deposition apparatus, a photoresist coating and development apparatus, an etching apparatus and other apparatuses are employed for executing the above-mentioned processes.

Here, the photoresist coating and development apparatus for the photolithography process is explained as an example. First, the semiconductor wafer is cleaned, applied to a hydrophobic process in an adhesion unit, cooled in a cooling unit, and coated by a photoresist film thereon in a photoresist coating unit. Then, the semiconductor wafer is pre-baked in a hot plate unit, cooled in the cooling unit, and light-exposed by a prescribed pattern thereon in a light-exposure unit. Further, the semiconductor wafer is applied to a post exposure baking process in the hot plate unit, cooled in the cooling unit, coated by a developing solution for developing the light-exposed pattern. Finally, the semiconductor wafer is post-baked in the hot plate unit in order to thermally transform and polymerize the film and improve an adhesion of the pattern to the semiconductor wafer. Thus, the photoresist coating and development apparatus is an integrated combination of a plurality of process units directed to a series of processes except the light exposure. Further, the photoresist coating and development apparatus includes a transport apparatus for transporting in and from every process unit.

The above-explained photoresist coating and development apparatus is controlled by a first control unit for controlling recipes for the processes and the transport apparatus and for communicate with a host computer and by a second control unit for controlling each process in each process unit, on the basis of the first control unit.

The above-mentioned first control unit outputs, toward the second control unit, data necessary for each process unit, while the second control unit controls each process unit, on the basis of the data from the first control unit and information from several sensors. Further, the control data is transmitted from the first control unit to the host computer.

Although complete control information is managed during and after executing the controls of each process unit, it is desired further that a more precise process control is required, that malfunctions and troubles in the apparatus are met quickly, and that a process history is captured in detail. Therefore, it is necessary to obtain not only the control data after completing the process unit control, but only measurement data such as temperature during actual processing, alarm data, or data of driving units.

However, it is intricate and impracticable to capture the process history by using conventional processing apparatuses, because the process elements and hardwares for the process elements are vast.

BRIEF SUMMARY OF THE INVENTION

An object of the present invention is to provide, in order to grasp process histories, a processing apparatus which may include various kinds of process units, an information storage apparatus and method for storing process histories, and a processing system wherein a plurality of the processing apparatuses are connected with and an information storage apparatus and a host computer.

The processing apparatus of the $1^{st}$ invention comprises: a processing apparatus body for executing a prescribed process to a target object; a control mechanism for controlling said processing apparatus body; and an information storage section for inputting a signal from said control mechanism and storing information included in said signal.

The processing apparatus of the $2^{nd}$ invention comprises: a processing apparatus body for executing a prescribed process to a target object; a control mechanism including a first and second controllers each of which executes different control of said processing apparatus body; and an information storage section for inputting a signal transmitted and received between said first controller and said second controller and storing information included in said signal.

The processing apparatus of the $3^{rd}$ invention comprises: a processing apparatus body including a plurality of process units for executing a prescribed process to a target object and a transport apparatus for delivering said target object between said plurality of process units; a first controller for controlling said processing apparatus as a whole; a second controller for controlling said plurality of process units; and an information storage section for inputting a signal transmitted and received between said first controller and said second controller and storing information included in said signal.

The information storage apparatus of the $4^{th}$ invention for storing information in a processing apparatus including a processing apparatus body for executing a prescribed process to a target object and a control mechanism for controlling said processing apparatus body, which comprises an information storage section and signal supply means, wherein: said signal supply means inputs a signal from said control mechanism and supplies said information storage section with said signal; and said information storage section stores said information included in said signal.

The information storage apparatus of the $5^{th}$ invention for storing information in a processing apparatus including a processing apparatus body for executing a prescribed process to a target object and a control mechanism which includes a first and second controller each of which executes a different control of said processing apparatus body, which comprises signal supply means and an information storage section, wherein: said signal supply means inputs a signal transmitted and received between said first controller and said second controller and supplies said information storage section with said signal; and said information storage section stores said information included in said signal.

The information storage apparatus of the $6^{th}$ invention for storing information in a processing apparatus including: a processing apparatus body which includes a plurality of process units for executing a prescribed process to a target object and a transport apparatus for delivering said target object between said plurality of process units; a first controller for controlling said processing apparatus as a whole; and a second controller for controlling said plurality of process units, which comprises signal supply means and an information storage section, wherein: said signal supply means inputs a signal transmitted and received between said first controller and said second controller and supplies said information storage section with said signal; and said information storage section stores said information included in said signal.

The information storage method of the 7th invention for storing information in a processing apparatus including: a processing apparatus body for executing a prescribed process to a target object; and a control mechanism for controlling said processing apparatus body, which comprises the steps of: taking out a signal from said control mechanism; and storing information included in said signal.

The information storage method of the 8th invention for storing information in a processing apparatus including: a processing apparatus body for executing a prescribed process to a target object; and a control mechanism including a first and second controller each of which executes a different control of said processing apparatus body, which comprises the steps of: taking out a signal which is transmitted and received between said first controller and said second controller; and storing said information included in said signal which is transmitted and received between said first controller and said second controller.

The information storage method of the 9th for storing information in a processing apparatus including: a processing apparatus body which includes a plurality of process units for executing a prescribed process to a target object and a transport apparatus for delivering said target object between said plurality of process units; a first controller for controlling said processing apparatus as a whole; and a second controller for controlling said plurality of process units, which comprises signal supply means and an information storage section, which comprises the steps of: taking out a signal which is transmitted and received between said first controller and said second controller; and storing said information included in said signal which is transmitted and received between said first controller and said second controller.

The processing system of the 10th invention comprises: a plurality of processing apparatus bodies each of which executes prescribed process to a target object; a plurality control mechanism each of which controls each of said plurality of processing apparatus bodies; a data storage section for taking in a signal from said control mechanism and storing information included in said signal; an information process section for inputting said information from said plurality of processing apparatus bodies and analyzing said information.

According to the present invention, it becomes easy to grasp the history of processes without employing any special measuring instrument, because the signal from the control mechanism which includes information necessary for grasping the process history such as detection information for processing such as temperature, particularly the signal transmitted and received between the first controller and the second controller, is taken out and stored in the information storage apparatus.

Concretely, the first controller controls the processing apparatus including the transport apparatus as a whole, while the second controller controls a plurality of the process units. In this case, the process history is easily grasped, because the second controller outputs information detected in the process units toward the first controller.

Further, according to the present invention, it becomes easy to grasp more precisely the history of processes, by employing additional sensors for detecting information which are not transmitted and received between the first controller and the second controller. In this case, the information included in the signal detected by the sensors are stored in the information storage apparatus.

Further, according to the present invention, a system with a plurality of processing apparatuses can be constructed in such a manner that the processing apparatuses share a information process section or host computer and a data storage apparatus and these processing apparatuses can be monitored by a monitor computer through a communication network.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detail description of the preferred embodiments given below, serve to explain the principles of the invention.

DETAILED DESCRIPTION OF THE INVENTION

Figure 1:
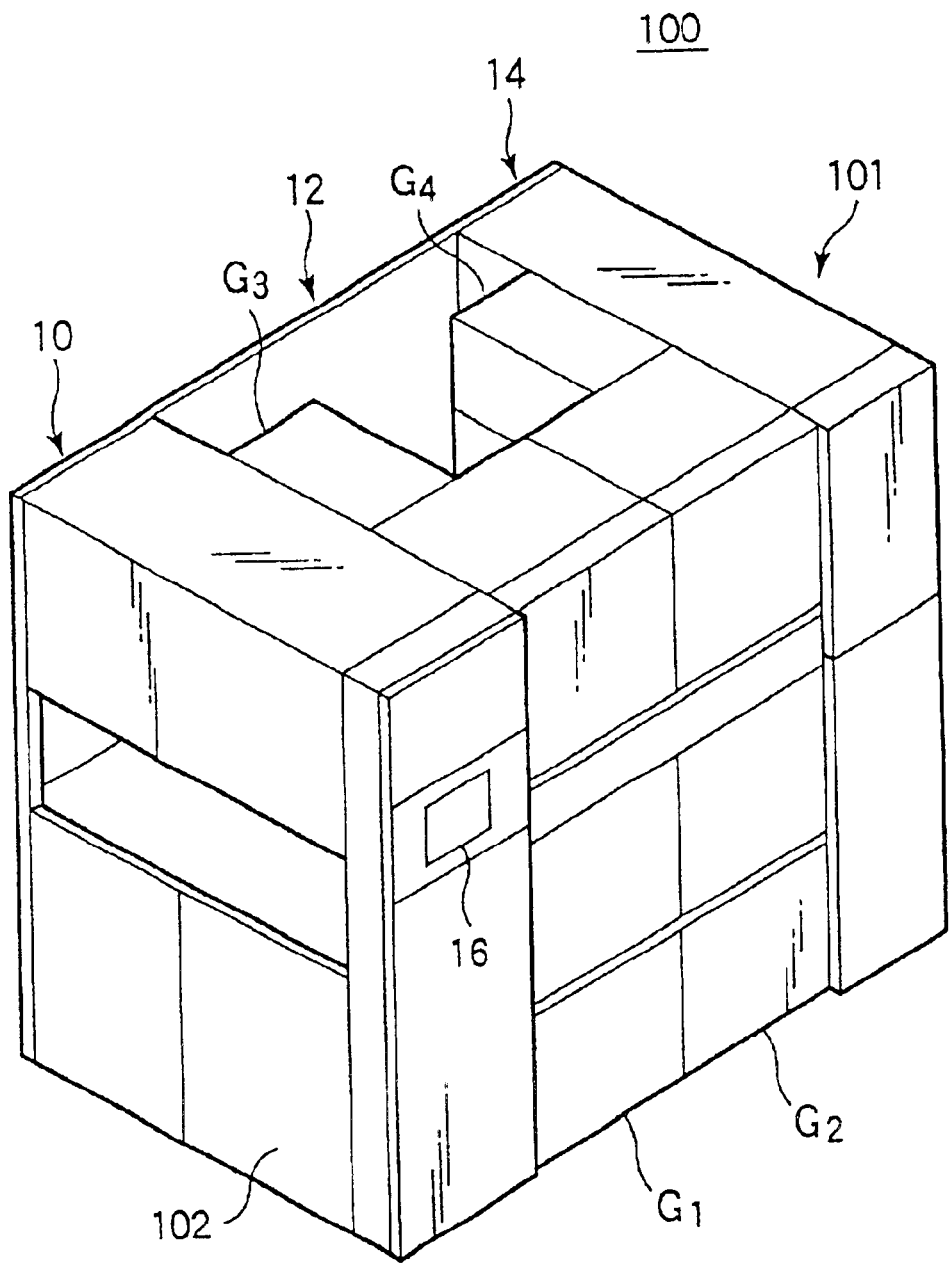
FIG. 1 is a perspective view of a photoresist coating and development apparatus of the present invention.

As shown in FIG. 1, the photoresist coating and development apparatus 100 of the present invention comprises an apparatus body 101 and control and data storage section 102 for controlling the apparatus body 101 and for storing control information and other information. The apparatus body 101 comprises a cassette station 10 for transporting, into and out of the apparatus 100 or a wafer cassette CR, the target objects to be processed such as semiconductor wafers or some other wafers W. For example, every 25 wafers W may be transported into and out of the apparatus 100 cassette CR. The apparatus body 101 further comprises a processing station 12 where there is arranged at prescribed positioned a plurality of one by one type process units for applying a prescribed process in the coating and development process to wafers on the one by one basis. Further, an interface section 14 for transport wafers into and out of a not-shown light-exposure apparatus or stepper. Further, the control and data storage section 102 is placed below the cassette station 10.

Figure 2:
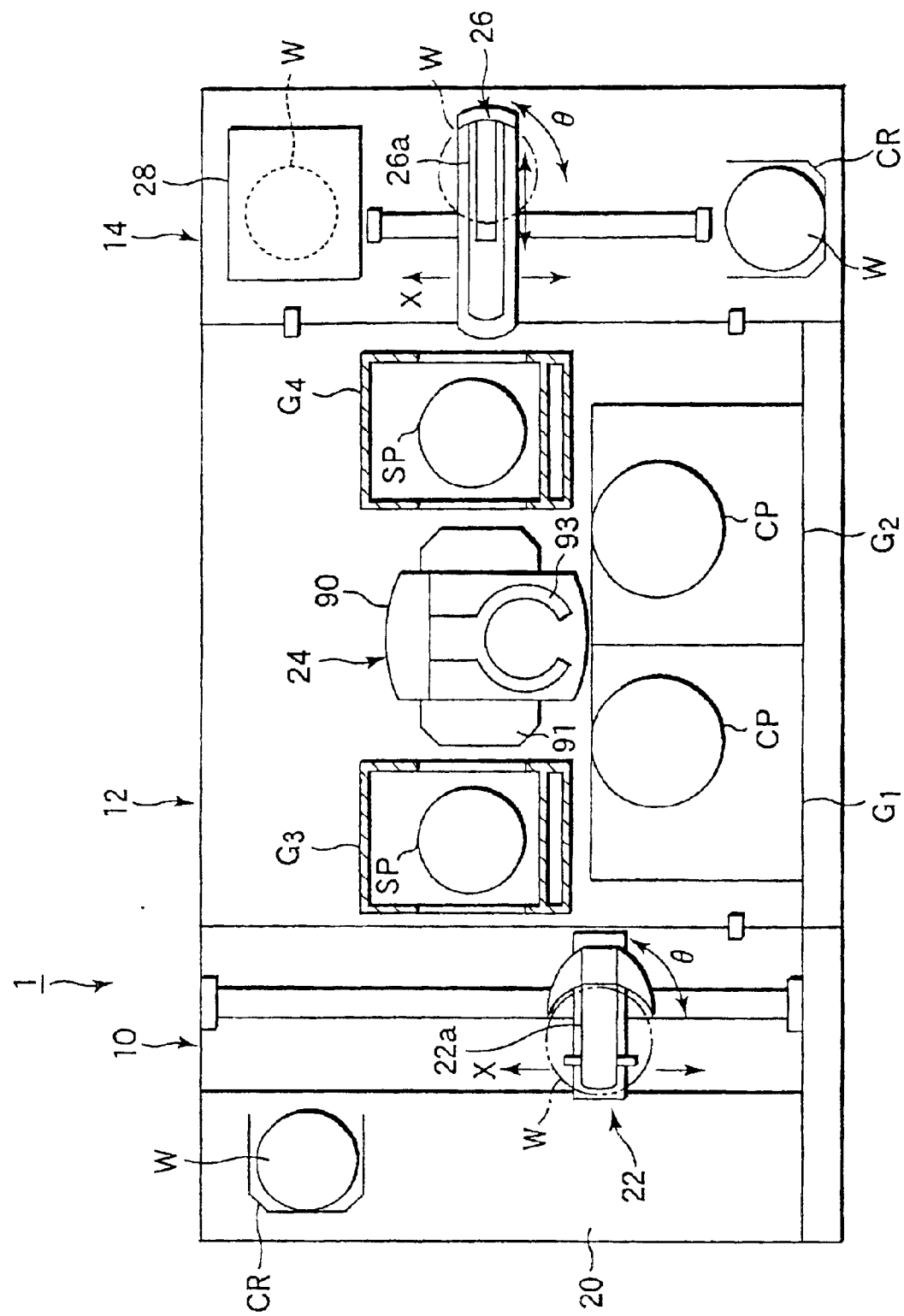
FIG. 2 is a plan view of the photoresist coating and development apparatus of the present invention.

The cassette station 10 as shown in FIG. 1 comprises a display 16, a cassette holder 20 and a wafer transport arm 22a which is movable in X, Y and Z directions and rotatable in θ direction as shown in FIG. 2. A plurality of the wafer cassette CR, for example, 4 wafer cassettes CR can be put on the cassette holder 20.

A display 16 as shown in FIG. 1 is used for monitoring, operating, inspecting the apparatus body 101 and executing a maintenance of the apparatus body 101. Concretely, the display 16 displays recipes including process procedure and time, maintenance information for notifying of electronic and mechanical states of each process unit, the measurement information, operation information, and wafer transport information.

As shown in FIG. 2, the processing station 12 comprises a first process unit group $G_1$ of liquid process units for applying a prescribed process to the wafer on a spin chuck in a cup CP, a second process unit group $G_2$, a third process unit group $G_3$ of thermal process units for applying a prescribed processing to the wafer on a holder SP, a fourth process unit group $G_4$, and main wafer transport mechanism 24 movable in the vertical direction.

Figure 4:
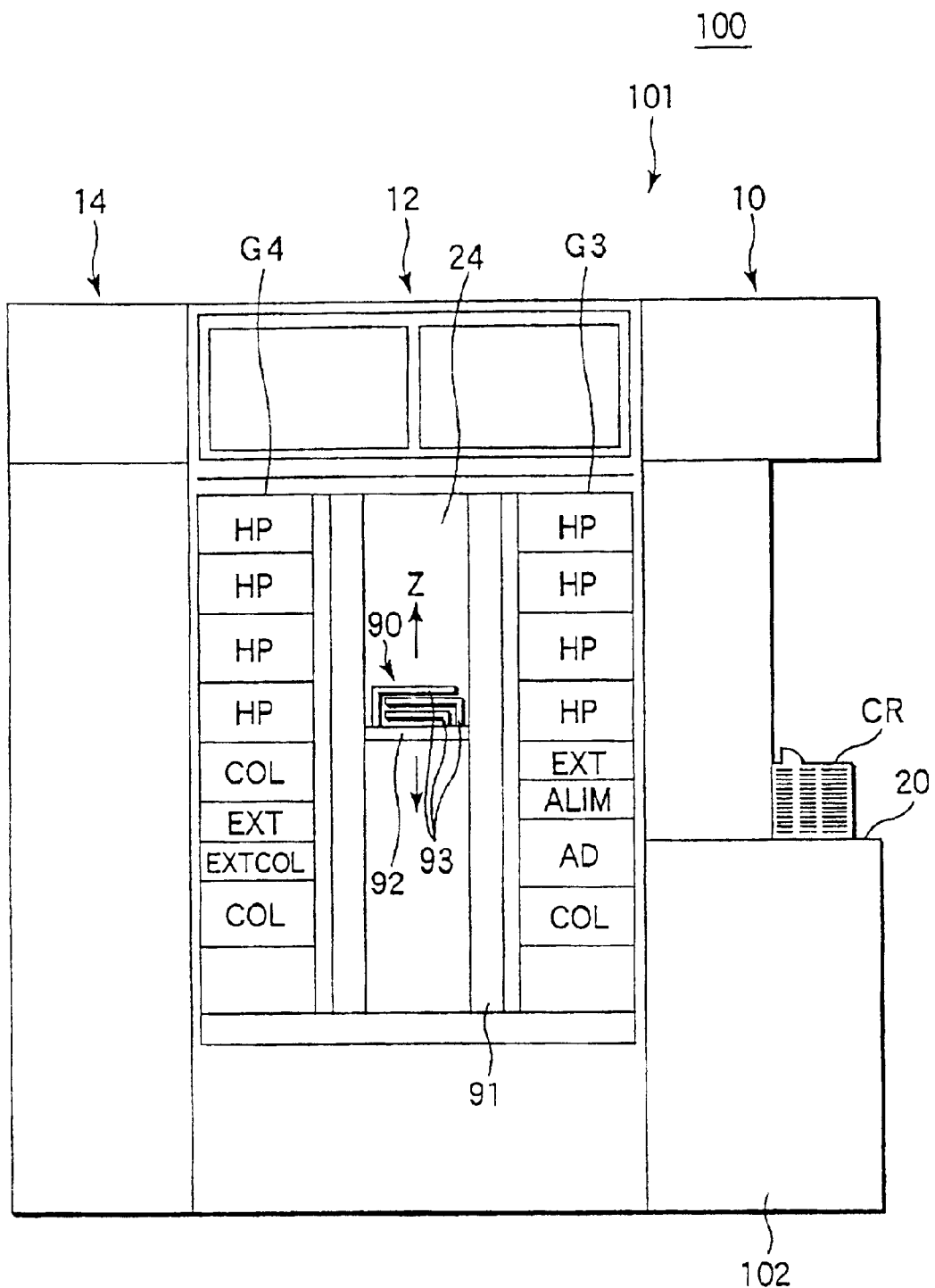
FIG. 4 is a rear view of the photoresist coating and development apparatus of the present invention.

As shown in FIG. 4, the main wafer transport mechanism 24 can move in a vertical direction or Z direction a wafer transport apparatus 90 inside a cylindrical support 91. The cylindrical support 91 is rotated by a not-shown Motor. The wafer transport apparatus 90 is also rotated in accordance with the rotation of the cylindrical support 91.

The wafer transport apparatus 90 has a plurality of holding members or pincettes 93 movable in the front and rear directions of a transport base 92, thereby delivering the wafer W between the process units.

Figure 3:
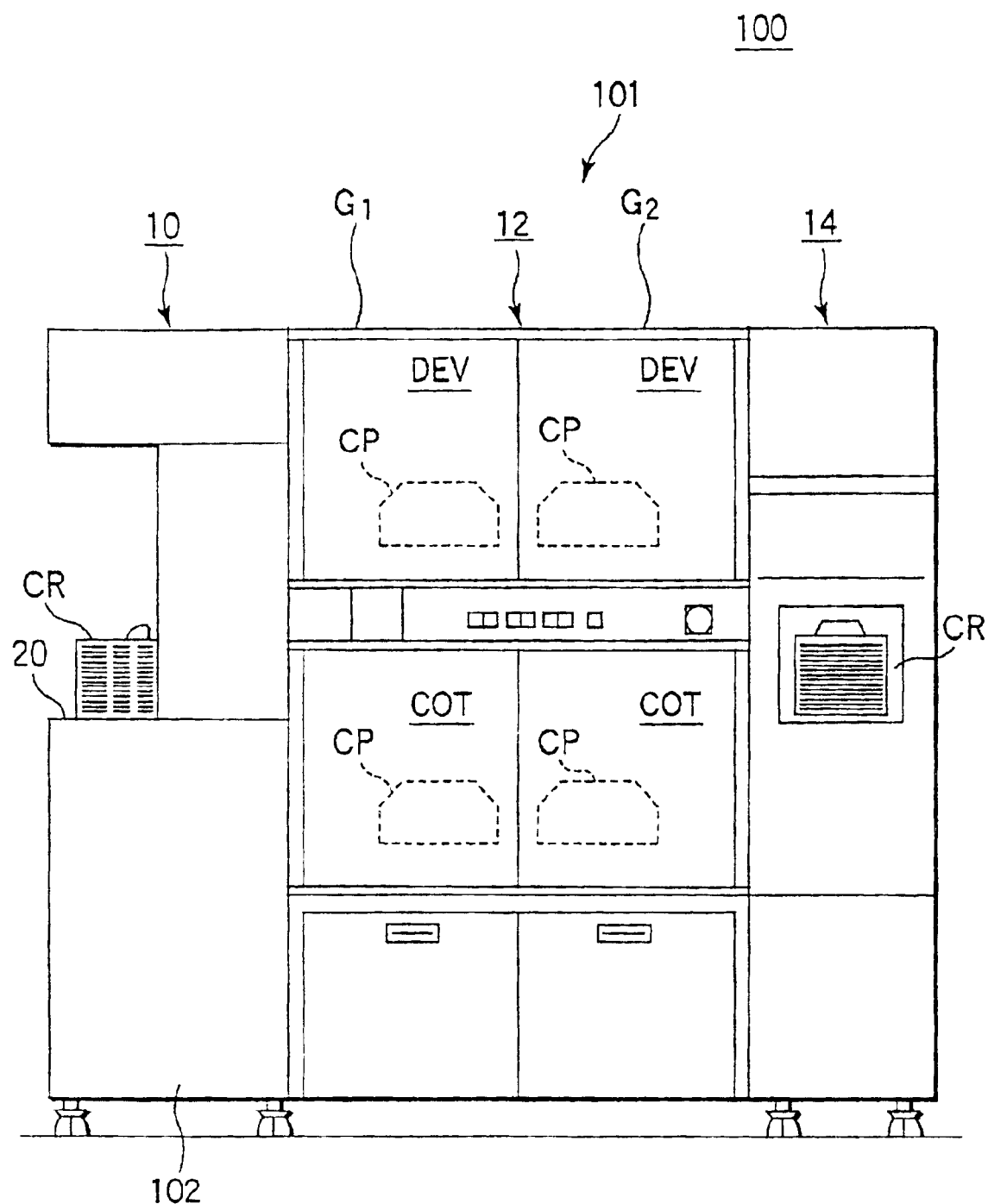
FIG. 3 is a front view of the photoresist coating and development apparatus of the present invention.

As shown in FIG. 3, there are stacked in the first process unit group $G_1$ the liquid process units such as a photoresist coating unit COT for spin-coating a photoresist film on the wafer surface, and a development unit DEV for developing a circuit pattern after light-exposure. Similarly, there are stacked the photoresist coating unit COT and the development unit DEV in the second process unit group $G_2$.

As shown in FIG. 4, in the third and fourth process units $G_3$ and $G_4$, there are stacked from the bottom to the top the eight units such as a thermal process unit such as a cooling unit COL for cooling the wafer W at a prescribed temperature, an adhesion unit (AD) for applying a hydrophobic process to the wafer before the resist coating, an alignment unit ALIM for adjusting the position of the wafer, an extension unit EXT for delivering the wafer between the stations, and a hot plate unit HP for heating the wafer W at a prescribed temperature.

A portable pickup cassette CR is arranged in the front portion of the interface section 14, and a peripheral exposure apparatus 28 is arranged in the rear portion, while there is arranged in the central portion a wafer transport mechanism 26 which has a wafer transport arm 26a which is movable in the X and Z directions and accessible to cassette CR and the peripheral exposure apparatus 28. Further, the wafer transport arm 26a is rotatable in θ direction and accessible to a not-shown wafer delivering platform in the peripheral exposure apparatus 28 and to the extension unit Ext in the process unit group $G_4$ in the processing station 12.

Figure 5:
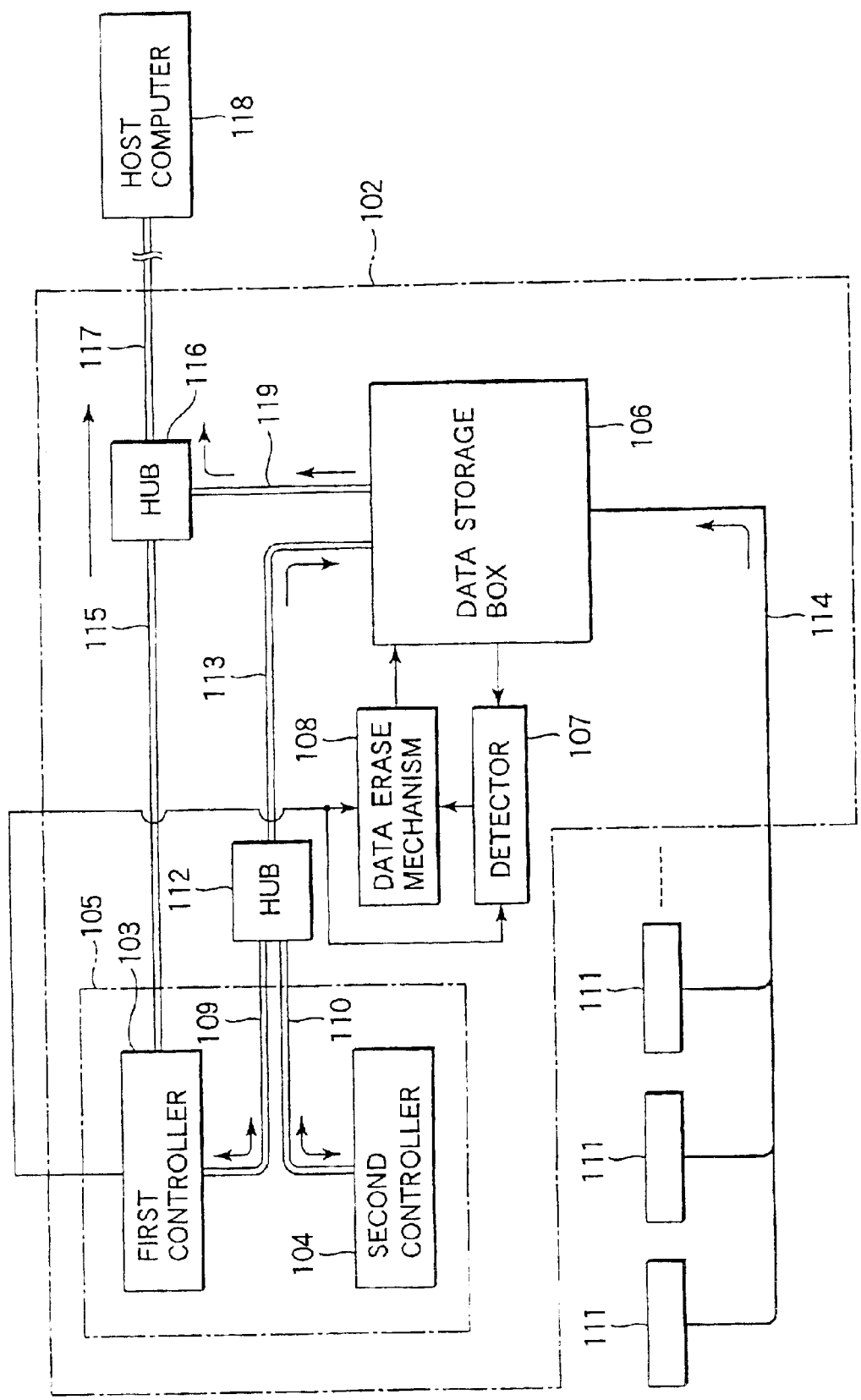
FIG. 5 is a block diagram of a control and data storage section in the photoresist coating and development apparatus of the present invention.

As shown in FIG. 5, the control and data storage section 102 comprises a control box 105 including a first controller 103 and a second controller 104, and a data storage box 106 for storing the data exchanged between the first controller 103 and the second controller 104. Further, The data storage section 102 may include a detector 107 for detecting a data quantity or available memory capacity in the data storage box 106, and a data erase mechanism 108 for erasing a prescribed data stored in the data storage box 106 when the available memory capacity is smaller than a prescribed value.

The first controller 103 controls the processing apparatus body 101 as a whole by controlling recipes, wafer transportation and display. Further, the first controller 103 is connected with a host computer 118 through a hub HUB 116, thereby communicating with the host computer 118 and instructing the second controller 104.

The second controller 104 is connected through a plurality of I/O boards with sensors and driving members, for outputting toward the first controller 103 measurement data such as temperature and humidity, alarm data and detection data, thereby controlling every process unit in the apparatus body 101, on the basis of the sensor information and instructions from the first controller.

A signal line 109 from the first controller 103 and a signal line 110 from the second controller 104 are connected with HUB 112 which is connected with the data storage box 106 through a signal line 113. Therefore, at least a part of data transmitted between the first controller 103 and the second controller 104 can be stored, for example, every 2 seconds, into the data storage box 106 through HUB 112.

Further, a plurality of additional sensors 111 are provided in order to detect signals which are not transmitted between the first controller 103 and the second controller 104, for example, a drive signal for driving a drive member such as a valve. These additional sensors 111 is connected through a signal line 114 with the data storage box 106 for storing the sensor data, for example, in a time period shorter than 2 seconds.

The first controller 103 is connected through a signal line 115 with HUB 116 which is connected through a signal line 117 with the host computer 118 which receives the data from the first controller 103. Further, the data storage box 106 is connected through a signal line 119 with HUB 116 which transfers data from the data storage box 106 to the host computer 118. Therefore, the host computer 118 can analyze data from the first controller 103 and data storage box 106.

Figure 6:
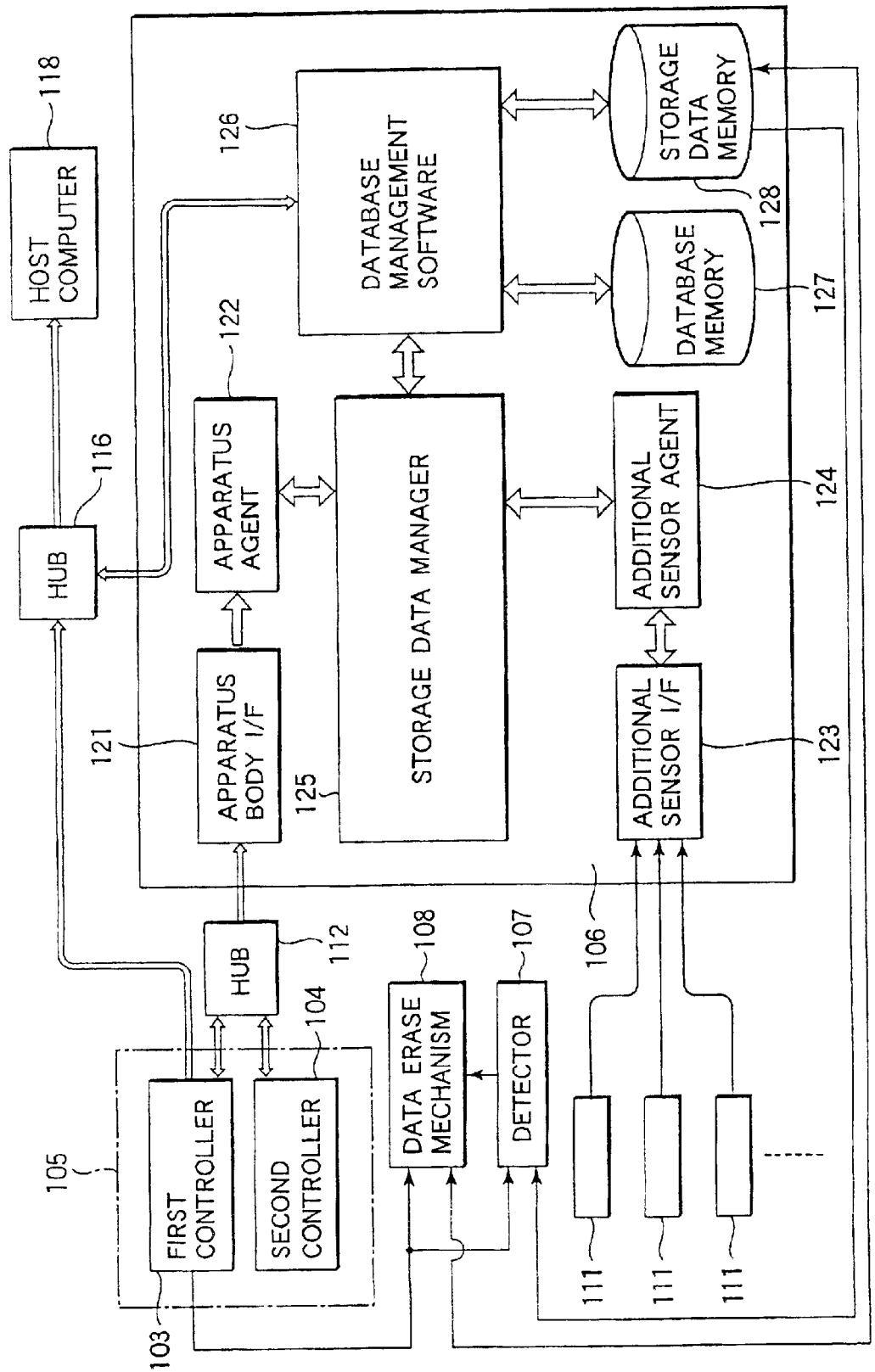
FIG. 6 is a block diagram of a data storage box of the control and data storage section as shown in FIG. 5.

As shown in FIG. 6, the data storage box 106 comprises: an apparatus body I/F 121 for receiving the signals transmitted between the first controller 103 and the second controller 104; an apparatus body agent 122 for processing the signals received by the apparatus body I/F 121; an additional sensor agent 123 for receiving the signals from the additional sensor 111; an additional sensor agent 124 for processing the signal received by the additional sensor agent 123; a storage data manager 125 for receiving and transmitting data to and from the apparatus body agent 122 and the additional sensor agent 124 and further processing and storing these data; a database management software 126, a database memory 127 for storing database for storing data; and storage data memory 128 for storing data.

The detector 107 detects, on the basis of an instruction from the first controller 103, at a prescribed timing, a data quantity stored in the storage data memory 128 in the data storage box 106. The detection timing may be such a timing when a process is completed for every wafer W, every cassette carrying wafers W, or every lot of wafers W.

On the other hand, the data erase mechanism 108 receives from the first controller 103 such information of a process executed in accordance with the detection timing of the detector 107 as a process of a wafer W, a cassette carrying wafers, or a lot of wafers. Further, the data erase mechanism 108 receives from the detector 107 a detection result. The data erase mechanism 108 erases, on the basis of these information, a prescribed information in the storage data memory 128, when the available memory capacity in the storage data memory 128 in the data storage box 106 is smaller than a prescribed value. Here, the prescribed value may be equal to or greater than an information quantity for the next processing. Further, the prescribed information may be erased in such a manner that oldest data is erased first or first stored data is erased first.

In the above-explained photoresist coating and development apparatus 100, the wafer W before processing is carried, by the wafer transport mechanism 22, out one by one from the wafer cassette CR, and is carried into the alignment unit ALIM. Then, the wafer W is aligned, carried out by the main wafer transport mechanism 24, and carried into the adhesion unit AD in order to execute an adhesion process. After completing the adhesion process, the wafer W is carried out by the main wafer transport mechanism 24, carried into the cooling unit COL in order to execute a cooling process. Next, the wafer W is transported to the resist coating unit COT in order to coat a photoresist, further, pre-baked at the hot plate unit HP. After completing the pre-baking, the wafer W is transported, through an extension cooling unit EXTCOL and then through an interface section 14, to a light-exposure apparatus adjacent to the interface section 14. Then, the light-exposed wafer W is carried by the wafer transport mechanism 26. Then, carried by the wafer transport mechanism 26 into the process section 12 through the interface section 14 and the extension unit EXT. In the processing station 12, the wafer W is transported by the main wafer transport mechanism 24 to the hot plate unit HP in order to execute a post-exposure process, further, transported to the development unit DEV in order to execute a development process, further, carried to the hot plate unit HP in order to execute a post-bake process, further carried to the cooling unit COL in order to execute a cooling process, and carried to the cassette station 10 through the extension unit EXT. Thus, the wafer transport mechanism 22 carries into the wafer cassette CR the wafer W after the prescribed processes.

A series of processes is controlled by the control box 105 in the control and data storage section 102. At this time, at least a part of signals transmitted and received between the first controller 103 and the second controller 104 in the control box 105 is received by and stored in the data storage box 106, for example, every 2 seconds. Further, these signals are processed by the apparatus body agent 122 and storage data manager 125 through HUB 112 and the apparatus body I/F 121, and stored in the storage data memory 128.

On the other hand, the information from the additional sensors 111 is received by and stored in the data storage box 106, for example, every 2 seconds. Further, this information is processed by the additional sensor agent124 and storage data manager 125 through the additional sensor agent 123, and stored in the storage data memory 128.

The database stored in the database memory 127 and the data stored in the storage data memory 128 are processed by the database management software 126, and outputted to the host computer 118 through HUB 116.

For example, the measurement data such as temperature and humidity among the above-mentioned data are stored repeatedly every prescribed time period, because they are necessary during process. Other data are stored in time sequence every wafer, every lot, or every process. By using these data stored in the data storage box, process histories are obtained. These data may be stored from a timing when the wafer W is carried into the process unit, from a timing when the process begins. These data may also stored only once, when a process of the wafer W or a lot of wafers W is started or completed, or when the wafer W is carried in or out.

Here, five typical data to be stored in the data storage box 106 are shown as follows, as an example.

(1) measurement data such as temperature, humidity, or pressure
(2) alarm data notifying trouble during processing
(3) dispense data in liquid process unit such as coating process unit COT
(4) drive system data such as cylinder
(5) wafer transport information and process unit information The measurement data (1) are controlled by the second controller 104, outputted from the second controller 104 to the first controller 103 under normal conditions, and stored in the data storage box 106 through HUB 112 connected with the first controller 103 and the second controller 104.

The alarm data (2) is generated by each process unit, received by the second controller 104, and outputted from the second controller 104 to the first controller 103, and stored in the data storage box 106 through HUB 112. The process histories are obtained in full detail, by storing the alarm data which indicate when, in which process unit, or during what kind of process, the alarm was generated.

Figure 7:
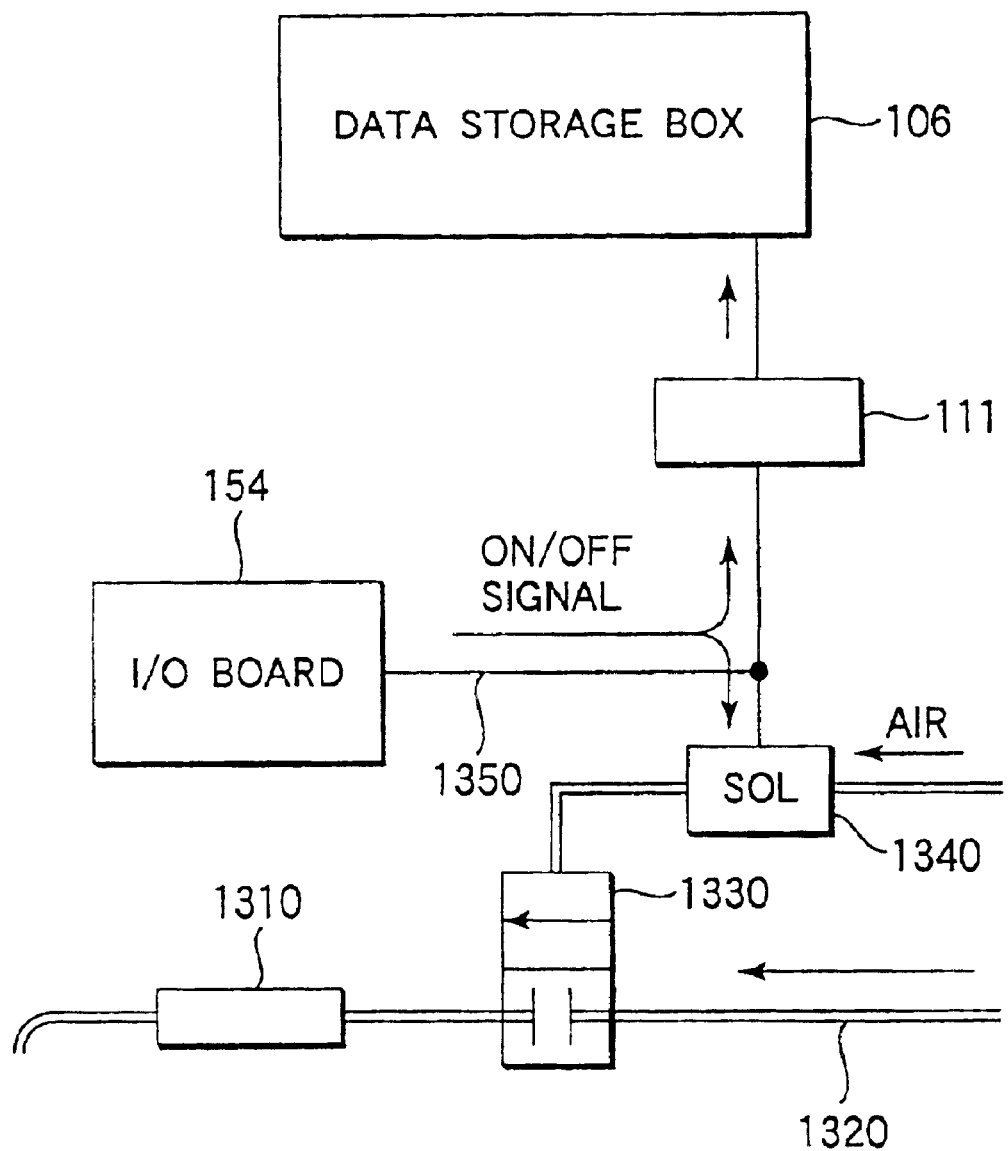
FIG. 7 is an illustration for explaining an example of data storage during supplying a process liquid in the photoresist coating and development apparatus of the present invention.

As shown in FIG. 7, regarding the dispense data (3), a ON/OFF signal for opening or closing air operation valve 1330 is outputted from the second controller 104 through the I/O board 154 to a solenoid valve 1340, when a spurting quantity of the process solution from a nozzle 1310 through a tube 1320 is controlled by the air operation valve 1330. In this case, the additional sensor 111 is connected with a control line 1350, thereby detecting the ON/OFF signal for storing that signal in the data storage box 106. As the ON/OFF signal is usually not transmitted and received between the first controller 103 and the second controller 104, the ON/OFF data directly outputted from the additional sensor 111 is stored in the data storage box 106. However such data as the above-explained ON/OFF signals may be stored in the data storage box 106 through the first controller 103 and the second controller 104. By storing these data, all the information about when the air operation valve 1330 was opened and closed. Further, for example, these data are related to the dispense data, thereby obtaining a process history.

Figure 8:
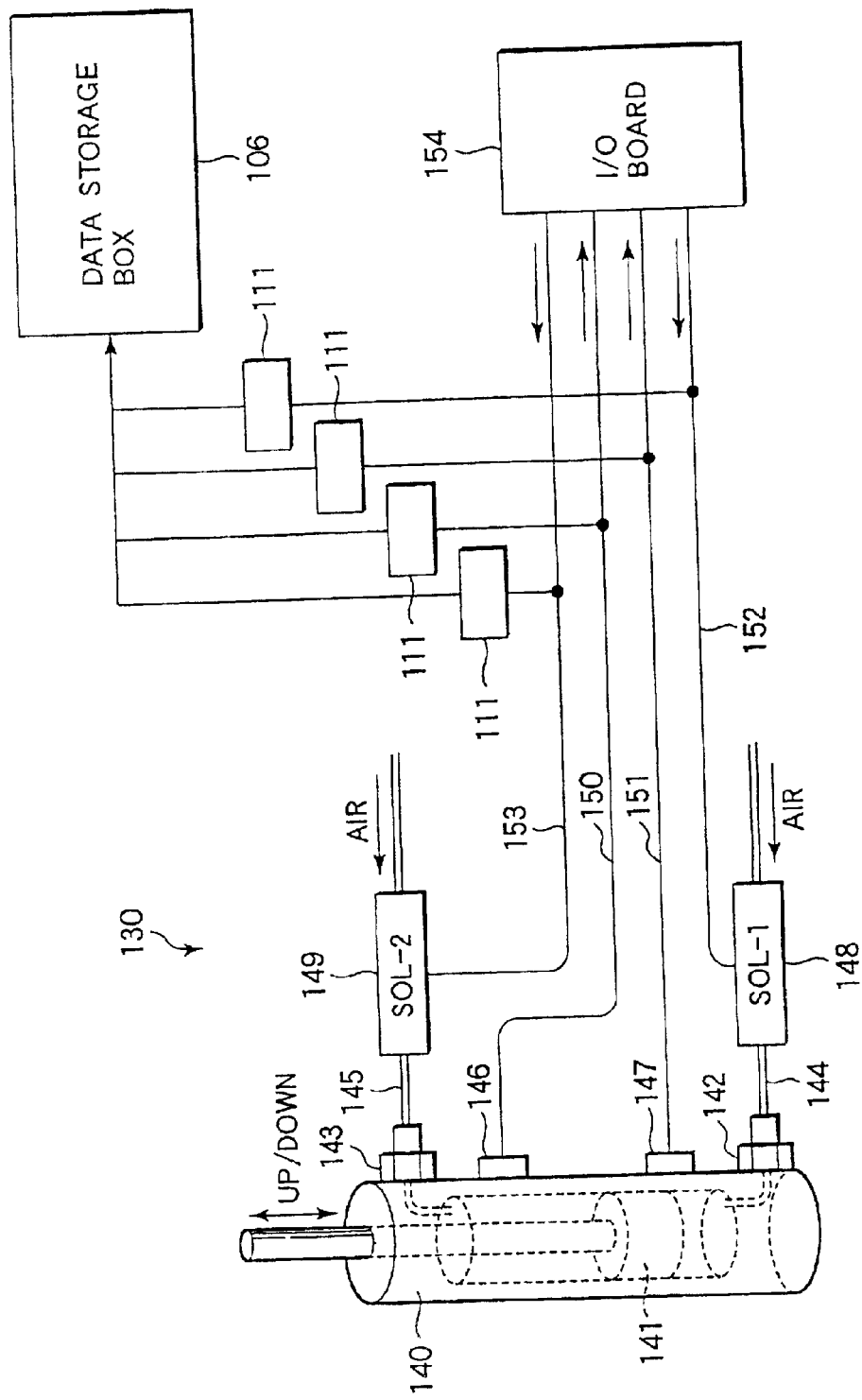
FIG. 8 is an illustration for explaining an example of data storage during controlling an air cylinder.

As shown in FIG. 8, the drive system data (4) is used for controlling a typical drive system such as an air cylinder for ascending and descending the wafer W and other thing. An air cylinder 130 comprises a cylinder body 140, and a piston 141 which moves forward or backward, or ascends or descends, in the cylinder body 140. A lower air inlet 142 connected with lower air tube 144 is provided at a lower portion of the cylinder body 140, while an upper air inlet 143 connected with upper air tube 145 is provided at an upper portion of the cylinder body 140, thereby ascending the piston 141 by introducing an air through the lower air tube 144 to the lower air inlet 142 and descending the piston 141 by introducing an air through the upper air tube 145 to the upper air inlet 143. Further, a first solenoid valve SOL-1 is provided around the lower air tube 144, while a second solenoid valve SOL-2 is provided around the upper air tube 145, thereby ascending or descending the piston 141 by switching on and off these solenoids. Furthermore, a first position sensor 146 is provided at an upper portion of the cylinder body 140, while a second position sensor 147 is provided at a lower portion of the cylinder body 140, thereby detecting an upper or lower limit position of the piston 141.

Further, the first position sensor 146, the second position sensor 147, the first solenoid valve 148, and the second solenoid valve 149 are connected with signal lines 150, 151, 152 and 153, respectively. Further, these signal lines are connected with I/O board 154 which is connected with the second controller 104 which transmits control signals through the I/O board 154 and signal lines 150, 151, 152 and 153 toward the first position sensor 146, the second position sensor 147, the first solenoid valve 148, and the second solenoid valve 149. Concretely, when a piston 141 starts moving, a control signal is outputted to either the first solenoid valve 148 or the second solenoid valve 149. Further, when a piston 141 is stopped, a detection signal from either the first position sensor 146 or the second position sensor 147 is outputted through the I/O board 154 to the second controller 104. Thus, the piston 141 is stopped, on the basis of the detection signal. In this case, the additional sensors 111 are connected with the signal line 150 of the first position sensor 146, the signal line 151 of the second position sensor 147, the signal line 152 of the first solenoid valve 148 and the signal line 153 of the second solenoid valve 143. Thus, the additional sensors 111 can receive detection signals from these position sensors and ON/OFF signals from these solenoid valves, thereby storing these detection signals and ON/OFF signals in the data storage box 106 and obtaining a history of open/close timings. Therefore, for example, a variation in the operation timing every air cylinder may be grasped and the operation timing may be finely tuned.

Figure 9:
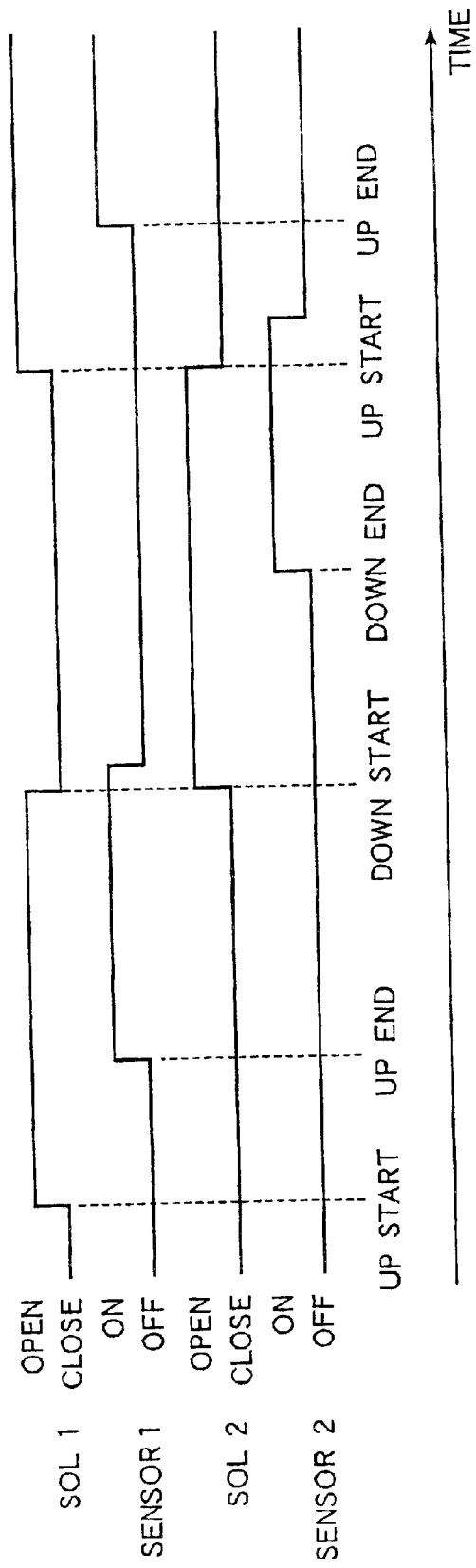
FIG. 9 is a timing chart for explaining data stored during controlling the air cylinder.

As shown in FIG. 9, actual stored data are time sequence data of ON/OFF timings of the first and second position sensors 146, 147, and ON/OFF timings of the first and second solenoid valves 148,149. Concretely, when the first solenoid valve 148 is opened, the piston 141 starts ascending (UP START). Further, when the first position sensor 146 is switched ON, the piston 141 stops ascending (UP END). Next, when the first solenoid valve 148 is closed and the second solenoid valve 149 is opened, the piston 141 starts descending (DOWN START). Further, when the second position sensor 147 is switched ON, the piston 141a stops descending (DOWN END). These steps are repeated by opening or switching on the first solenoid valve 148 in order to start ascending (UP START) the piston 141.

The above-explained air cylinder 130 may be used in other cases such as an operation of ascending and descending pins, wherein the wafer W is received by ascending and descending pins over the hot plate in hot plate unit HP, placed on the hot plate by descending the piston 141, held up after a prescribed time period by ascending the ascending and descending pins, and carried out by the pincettes 93 from the hot plate unit.

As the drive system data is not transmitted and received between the first controller 103 and the second controller 104 under normal conditions, the drive system data directly outputted from the additional sensors 111 and stored in data storage box 106. However, the drive system data may be stored in the data storage box 106 through the first controller 103 and the second controller 104.

The wafer transport information and process unit information (5) are stored in the data storage box 106 through HUB 112, because wafer transport information in the first controller 103, and information about carrying the wafer W in and out each process unit and process information in each process unit in the second controller 104 are transmitted and received between the first controller 103 and the second controller 104. The wafer transport information actually stored include such information about the carrying the wafer W in and out each process unit, while the process information actually stored include such information about the beginning and completion of processing in each process unit.

In this manner, as the data transmitted and received between the first controller 103 and the second controller 104 are received by and stored in the data storage box 106, through HUB 112 and at a prescribed timing, various data during processes are collected automatically, thereby easily obtaining data necessary for grasping the process history. Concretely, the data transmitted and received between the first controller 103 and the second controller 104 include detection data for processing, alarm data, process data, wafer transport data, and other data necessary for grasping process history. Therefore, it becomes easy to grasp the process history by reading out the data stored in the data storage box 106.

Further, as the signals which are not transmitted and received between the first controller 103 and the second controller 104 are detected by the additional sensors 111, stored data are diversified and process history is grasped more precisely.

However, as great quantity of data are stored in the data storage box 106, the quantity of stored data may exceed in a relatively short time period, and important data may not possibly be stored. Therefore, it is necessary to erase at a prescribed timing a prescribed data in the data storage box 106 in order to store effectively the process data.

Figure 10:
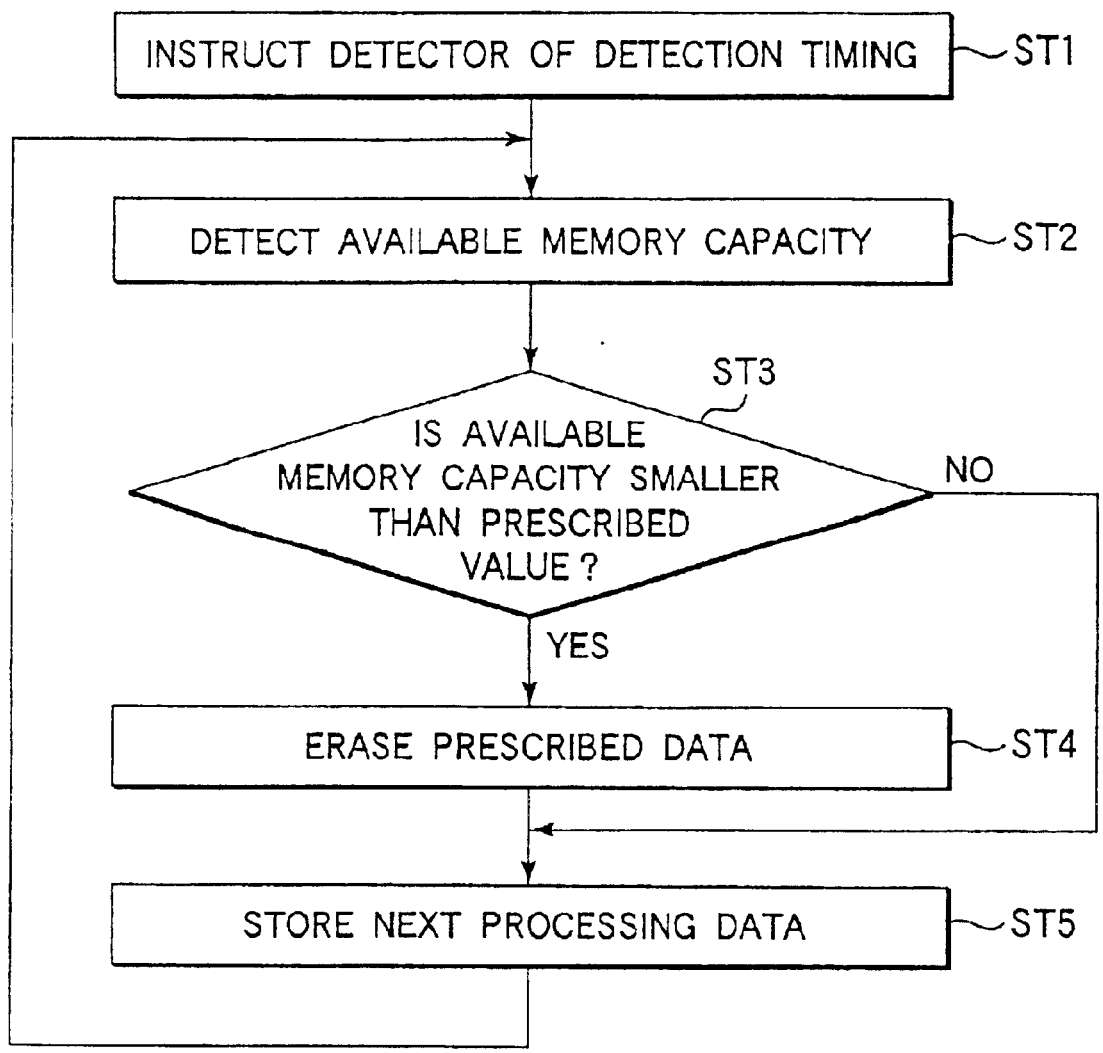
FIG. 10 is a flow chart for explaining the operation of the data erase mechanism.

FIG. 10 is a flow chart for explaining the operation of the data erase mechanism.

First, the first controller 103 instructs the detector 107 of the detection timing, at ST1. The detection timing may be such a timing when every process of a wafer W, a cassette carrying wafers W, or a lot of wafers W is completed.

Next, the detector 107 detects at the above-mentioned detection timing the still available memory capacity or not used memory capacity in the storage data memory 128 in the data storage box, at ST2.

The data erase mechanism 108 receives from the first controller 103 such information of a processing executed in accordance with the detection timing of the detector 107 as a processing of a wafer W, a cassette carrying wafers, or a lot of wafers. Further, the data erase mechanism 108 receives from the detector 107 a detection result. Then, it is determined whether the still available memory capacity is smaller than the prescribed value which may be equal to or greater than an information quantity for the next processing, at ST3.

When the still available memory capacity in the storage data memory 128 in the data storage box 106 is smaller than the prescribed value, the data erase mechanism 108 erases the prescribed information in such a manner that oldest data is erased first or first stored data is erased first, at ST 4. Here, the erased data quantity is such a manner that the still available memory capacity in the storage data memory 128 is at least greater than the information quantity of the next processing.

On the other hand, when the still available memory capacity in the storage data memory 128 in the data storage box 106 is greater than or equal to the prescribed value, the data erase mechanism 108 does not execute the erase operation.

After the erase operation, data of the next processing is stored, at ST5, and the step ST2 is repeated.

Therefore, failure in storing information itself is avoided, because a part of the data stored in the stored data memory is automatically erased at a prescribed timing.

Further, the present invention can be modified within the technical idea of the present invention, without limiting it to the disclosed embodiment. For example, although the data transmitted and received between the first controller 103 and the second controller 104 are taken into and stored in the data storage box 106 in the above-explained embodiment, the data which are taken in and stored may be the data from the first controller 103, the data from the second controller 104, or 2 or more data among the data from the first controller, the data from the second controller 104, and the data transmitted and received between the first controller 103 and the second controller 104. Further, signals from control mechanism may be directly stored, without using any controller. Furthermore, although the data from the additional sensors 111 are directly stored in the data storage box 106 in the disclosed embodiment, the additional sensors are not necessarily required, if all the information are transmitted and received between the first controller 103 and the second controller 104.

Although the older data are erased in the above-explained embodiment, the present invention is not limited to that embodiment. For example, specific data concerning each wafer may be erased.

Further, although a photoresist coating and development apparatus are explained as an example, the present invention can be applied to all the processing apparatus for processing a substrate such as a semiconductor wafer.

Further more, the present invention is extended to a processing system including a plurality of the processing apparatuses already explained.

For example, two or more control and data storage section may share the HUB 116 connected with the host computer 118, thereby monitoring and analyzing all the process units by using only one host computer.

Further, it may be desired that a processing apparatus with the data storage box is added to other processing apparatus without the data storage box. Furthermore, it is desired that a plurality of processing apparatuses share the data storage box in order to implement a efficient and centralized management of the stored data. A processing system suitable for these purposes is shown in FIG. 11.

Figure 11:
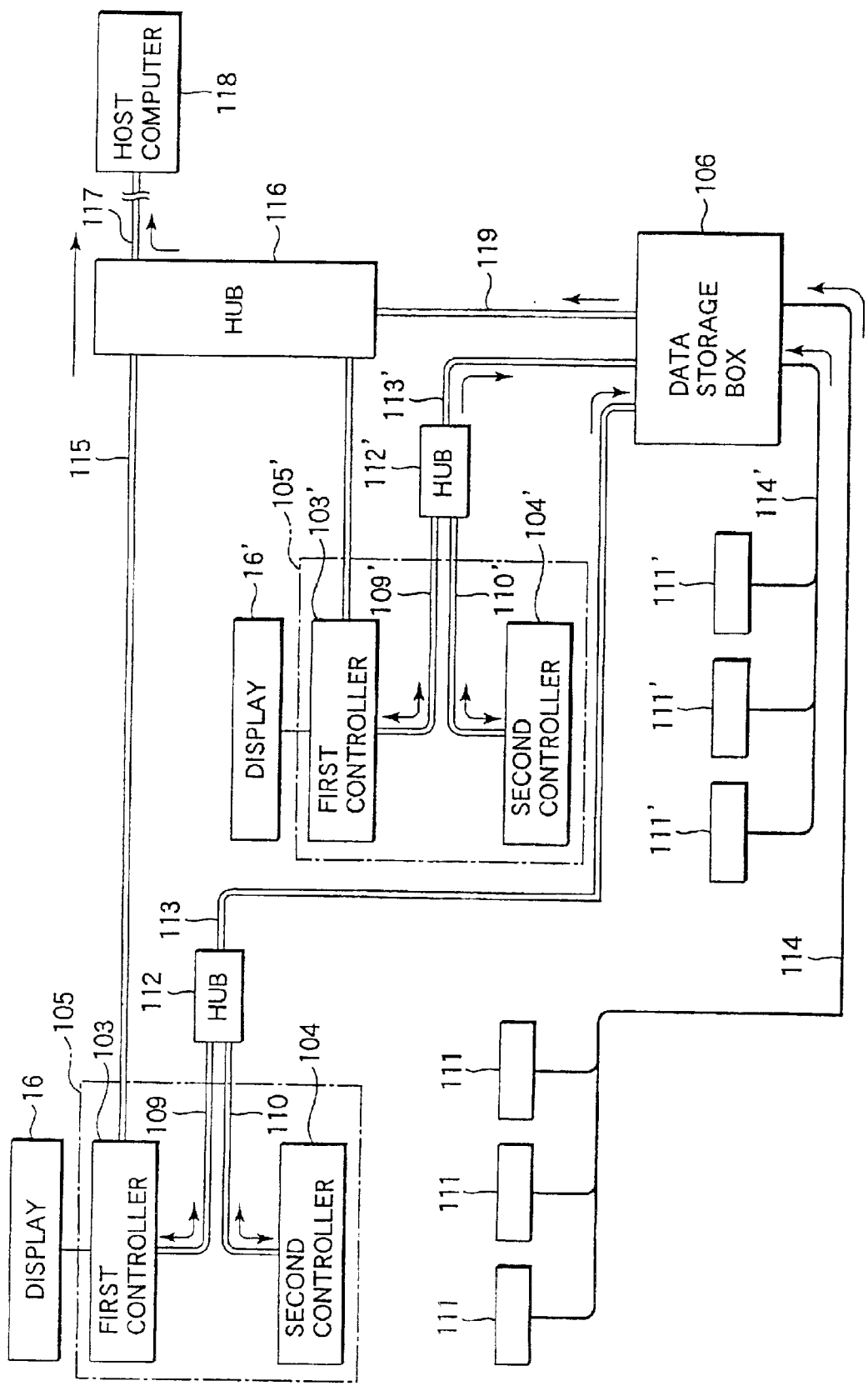
FIG. 11 is a block diagram of a processing system which shares a host computer and a data storage box.

As shown in FIG. 11, HUB 112 connected with the control box 105 and HUB 112' connected with the control box 105' share the data storage box 106, and the first controller 103 in the control box 105 and the first controller 103' in the control box 105' are connected with HUB 116, thereby combining the processing apparatus 100 with the processing apparatus 100'. Here, the processing apparatus 100 may be of the same kind as, or of a different kind from the processing apparatus 100'. For example, the processing apparatus 100 may be a photoresist coating and development apparatus, while the processing apparatus may be a semiconductor stepper.

A processing system with three or more processing apparatuses is similarly constructed in order to share the data storage box 106, HUB 116 and the host computer 118, thereby monitoring operation state of processing apparatuses on a display of the host computer 118, for example, by switching the display screen every processing apparatus, or by using divided screen for a plurality of processing apparatuses. Further, the host computer 118 can not only monitor but also instruct each processing apparatus, on the basis of monitoring results. In this case, bi-directional communications are introduced between the host computer 118 and HUB 116 and between HUB 116 and the first controller 103.

Figure 12:
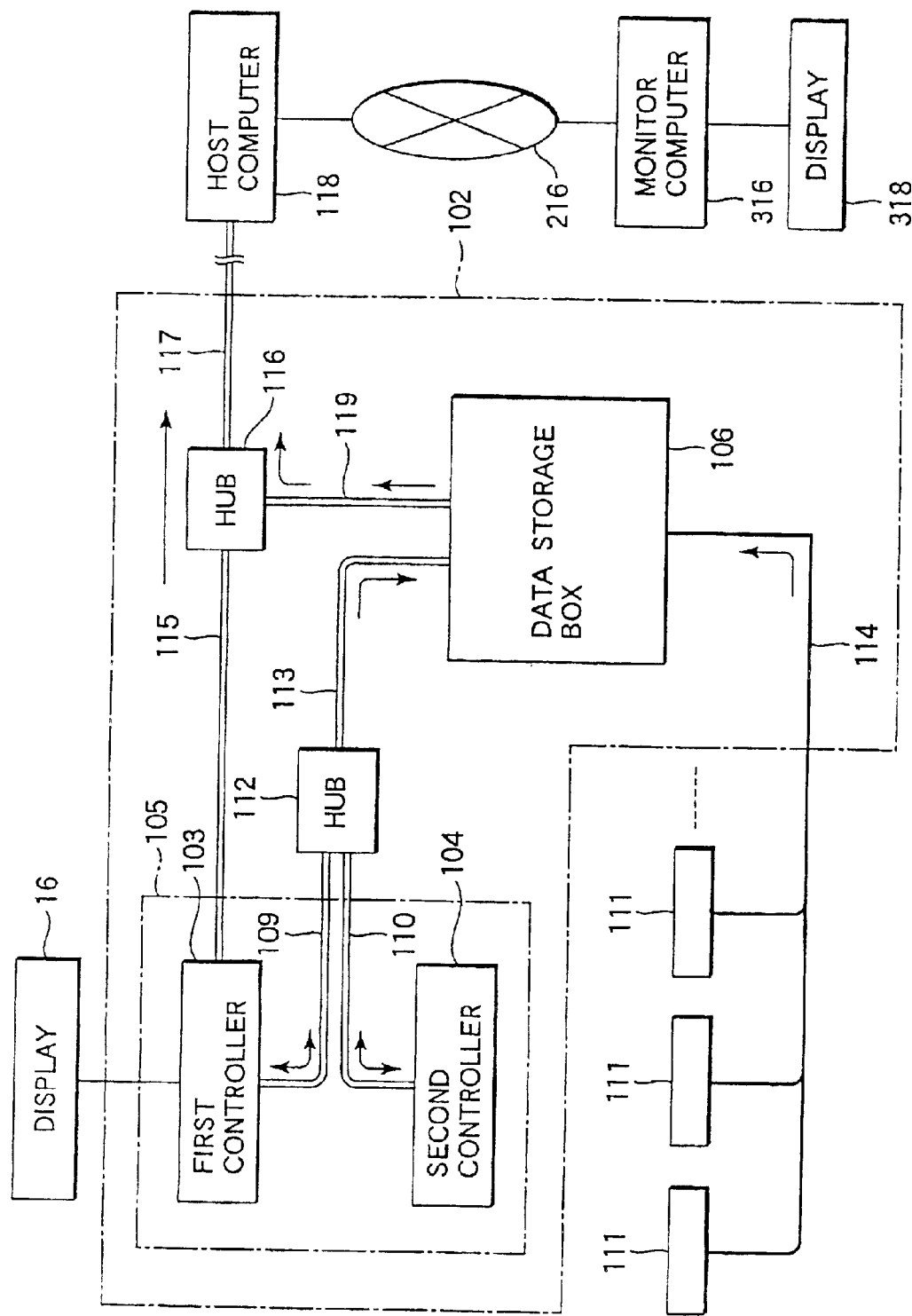
FIG. 12 is a block diagram of a remote monitoring system with a monitoring computer which is connected through a communication network with a host computer connected with a processing apparatus.

Furthermore, the present invention is extended to a processing system, wherein the processing apparatus or system is monitored via a communication network, as shown in FIG. 12.

As shown in FIG. 12, control and data storage section 102 is monitored by a monitor computer 316 via communication network 216 such as an internet. The second controller 104 outputs the measurement data such as temperature and humidity, alarm data, detection data and other data to the first controller 103 and the data storage box 106. On the other hand, the first controller 103 controls each process unit in the apparatus body 101, on the basis of the data from the second controller 104. Further, the outputs from the additional sensors 111 are stored in the data storage box 106. Therefore, all the data including the outputs from the first controller 103, the second controller 104, and the additional sensors 111 can be transmitted to the host computer 118. Accordingly, all or a part of the data stored in the data storage box 106 can be transmitted through the network 216 to the monitor computer 316 which includes a display 318 for displaying, for example, necessary data among the data displayed on display 16 in the apparatus body 101.

The monitor computer 316 receives monitor data from the host computer 118, and the display 318 connected with the monitor computer 316 displays the alarm information, the measurement information, the operation information, the wafer transport information and other information. Concretely, the monitor computer 316 analyzes the information for controlling the process unit from the first controller 103 and the display 318 displays the analysis results. Further, the monitor computer 316 may recognizes a malfunctioned unit, on the basis of the alarm data from the second controller 104, instruct to stop the malfunctioned unit, make a repair plan, and prepare repair staff. Further, the monitor computer 316 may find out abnormalities and malfunctions of the additional sensors 111, on the basis of the outputs from these sensors, and prepare new sensors.

Thus, operation state of a plurality of processing apparatuses can be monitored by a monitor computer through a communication network. Further, the monitor computer can instruct each process unit, on the basis of the monitor result, by establishing bi-directional communications between the monitor computer 316 and the monitor computer 118, between the host computer 118 and HUB 116, and between HUB 116 and the first controller 103.

Such a remote monitor system with two or more processing apparatuses connected with the host computer 118 can be similarly constructed.

The embodiments described above are simply intended to clarify the technical concept of the present invention. Of course, the present invention should not be limited to the embodiments described above in interpreting the technical scope of the present invention. The present invention can be worked in variously modified fashions within the spirit of the present invention and within the scope defined by the accompanying claims.

What is claimed is:

1. A substrate processing apparatus comprising:
a processing apparatus body including,
   a plurality of process units configured to execute a predetermined process to a substrate, and
   a transport apparatus configured to move the substrate between the plurality of process units;
a control apparatus including,
   a first controller configured to transmit a first instruction signal, and to control the processing apparatus body as a whole, and
   a second controller configured to individually control the plurality of process units based on the first instruction signal received from the first controller, and to transmit a first signal to the first controller, the first signal including information necessary to grasp a process history of the plurality of process units;
a hub connected to the first and second controllers, the hub configured to receive the first signal transmitted by the second controller;
an information storage section connected to the hub, the information storage section configured to read the first signal from the hub, and to store the information necessary to grasp the process history of the plurality of process units included in the first signal; and
a host computer connected to the first controller and to the information storage section, the host computer being configured to analyze the first instruction signal received from the first controller and a second signal received from the information storage section, the second signal including the information necessary to grasp the process history of the plurality of process units retrieved from the information storage section.

2. The substrate processing apparatus according to claim 1, wherein the host computer transmits a second instruction signal to the first controller, the second instruction signal configured to instruct the first controller to control the processing apparatus body based on an analysis result of the first instruction signal and the second signal.

3. A substrate processing system comprising:
a plurality of processing apparatus bodies each including,
   a plurality of process units configured to execute a predetermined process to a substrate, and
   a transport apparatus configured to move the substrate between the plurality of process units;
a plurality of control apparatuses each including,
   a first controller configured to transmit a first instruction signal, and to control a respective one of the plurality of processing apparatus bodies as a whole, and
   a second controller configured to individually control a plurality of process units in the respective one of the plurality of processing apparatus bodies based on the first instruction signal received from the first controller, and to transmit a first signal to the first controller, the first signal including information necessary to grasp a process history of the plurality of process units in the respective one of the plurality of processing apparatus bodies;
hubs connected to the respective first and second controllers, the hubs being configured to receive the respective first signals transmitted by the respective second controllers;
an information storage section connected to the hubs, the information storage section configured to read the respective first signals from the respective hubs, and to store the information necessary to grasp the process history of the plurality of process units included in the respective first signals; and
a host computer connected to the first controllers and to the information storage section, the host computer being configured to analyze the respective first instruction signals received from the respective first controllers and second signals received from the information storage section, the respective second signals including the respective information necessary to grasp the process history of the plurality of process units retrieved from the information storage section.

4. The substrate processing system according to claim 3, further comprising:
a monitor computer connected to the host computer through a communication network.

5. The substrate processing system according to claim 3, wherein the host computer transmits second instruction signals to the respective first controllers, the respective second instruction signals configured to instruct the respective first controllers to individually control the respective one of the plurality of processing apparatus bodies based on an analysis result of the respective first instruction signals and the respective second signals.

6. The substrate processing system according to claim 3, wherein each of the plurality of control apparatuses further comprises:
a display configured to display at least one of recipe information, maintenance information, measurement information, and operation information relative to each of the plurality of processing apparatus bodies, and a transport information of the substrate.

* * * * *

UNITED STATES PATENT AND TRADEMARK OFFICE
CERTIFICATE OF CORRECTION

PATENT NO. : 6,990,380 B2
DATED : January 24, 2006
INVENTOR(S) : Yoshimoto et al.

It is certified that error appears in the above-identified patent and that said Letters Patent is hereby corrected as shown below:

<u>Title page,</u>
Items [45] and [*] Notice, should read as follows:
-- [45] **Date of Patent: *Jan 24, 2006**

[*] Notice:   Subject to any disclaimer, the term of this patent is extended or adjusted under 35 U.S.C. 154(b) by 220 days.

This patent is subject to a terminal disclaimer. --.

Signed and Sealed this

Eighteenth Day of April, 2006

JON W. DUDAS
*Director of the United States Patent and Trademark Office*